United States Patent [19]
Takasuka et al.

[11] 4,358,782
[45] Nov. 9, 1982

[54] SEMICONDUCTOR DEVICE

[75] Inventors: Kaoru Takasuka; Tatsumi Arakawa; Fumio Matushita; Hidehiko Kobayashi, all of Fuji, Japan

[73] Assignee: Asahi Kasei Kogyo Kabushiki Kaisha, Japan

[21] Appl. No.: 113,043

[22] Filed: Jan. 17, 1980

[51] Int. Cl.³ ............................................. H01L 45/00
[52] U.S. Cl. ................................ 357/2; 357/15; 357/30; 357/23
[58] Field of Search ................. 357/2, 30, 4, 23, 23 R, 357/23 C, 23 TF, 15

[56] References Cited

U.S. PATENT DOCUMENTS

| | | | |
|---|---|---|---|
| 4,064,521 | 12/1977 | Carlson | 357/2 |
| 4,117,506 | 9/1978 | Carlson | 357/30 |
| 4,200,473 | 4/1980 | Carlson | 357/2 X |
| 4,291,318 | 9/1981 | Sansregret | 357/2 |

OTHER PUBLICATIONS

McGill et al., J. Appl. Phys. 50 (1) Jan. 1979, pp. 548–550.

*Primary Examiner*—Martin H. Edlow

[57] ABSTRACT

A novel semiconductor device having an oxide semiconductor layer between an amorphous silicon hydride and a metallic layer has been found to have an excellent collection efficiency for light, particularly, in the range of short wavelengths and a high energy conversion efficiency as compared with the conventional Schottky barrier semiconductor device and the semiconductor device having a MIS structure. Further, it has been found that the present novel semiconductor device has an excellent storage stability for a long period of time.

6 Claims, 4 Drawing Figures

SEMICONDUCTOR DEVICE

This invention relates to a semiconductor device in which amorphous silicon hydride is employed. More particularly, the present invention is concerned with a novel amorphous silicon hydride semiconductor device having an oxide semiconductor layer between the amorphous silicon hydride layer and a metallic layer.

The term "amorphous silicon hydride" used herein is intended to mean an amorphous silicon which is obtained by a glow discharge in silane, or a sputtering, vapor deposition or ion plating of silicon in an atmosphere of hydrogen. Recently, it was found that such an amorphous silicon hydride has a carrier life time of $10^{-7}$ sec. or more and an average density of localized states in the energy gap on the order of $10^{17}/cm^3$ or less. For the amorphous silicon hydride, the drift mobility for electrons and holes is $10^{-3}$ cm$^2$/V·sec. or more. It was also found that with respect to the amorphous silicon hydride it is possible to make an electronic control, namely, p-n control. Thus, effective application of amorphous silicon hydride to semiconductor elements is expected. In this connection, it is particularly noted that such an amorphous silicon hydride can be manufactured by a relatively low temperature process and, with a thickness as small as several μm or less, is capable of exerting its functions, leading to a remarkable lowering of cost. Accordingly, intensive research is being carried out for developing high efficiency solar cells employing amorphous silicon hydride semiconductor devices so that the efficiency of conversion of solar radiation to electrical energy may be improved.

In the field of solar cells using amorphous silicon hydride, there has already been proposed a photovoltaic device utilizing a Schottky barrier produced at the interface between the amorphous silicon hydride and a metal having a high work function such as platinum or the like. The energy conversion efficiency of the solar cell of the above-mentioned kind, however, is as low as about 5.5% as measured under solar light irradiation, which is unsatisfactory. The open circuit voltage of the above-mentioned solar cell, which voltage is one of the criteria for determining the energy conversion efficiency, is only about 0.8 V. Further, because of the contact of the amorphous silicon hydride with the metal, the diffusion of the metal into the amorphous silicon hydride layer occurs, leading to a disadvantage that the solar cell of this kind is poor in storage stability.

On the other hand, with a view to increasing the open circuit voltage, there was proposed a photovoltaic device having a MIS (Metal Insulator Semiconductor) structure. The proposed device has a very thin insulating layer between the semiconductor and a certain kind of metal. The insulating layer is typically of silicon dioxide or silicon nitride and is thin in thickness (10 to 30 Å) so that charge carriers are capable of tunneling through the layer. The photovoltaic device having such a structure produces a higher open circuit voltage than the conventional Schottky barrier type photovoltaic device. However, even with such a proposed device, no change or improvement is attained with respect to collection efficiency as a function of wavelengths.

With a view to resolving the problems accompanying the conventional amorphous silicon semiconductor devices, extensive and intensive researches have been made. As a result, it has been found that such a novel semiconductor device having a layer structure represented by an amorphous silicon hydride layer—oxide semiconductor layer—metal, has an excellent collection efficiency for light, particularly, in the range of short wavelengths (the side of higher energy) as demonstrated in FIG. 3 which will be mentioned later and, accordingly, a high energy conversion efficiency as compared with the conventional Schottky barrier semiconductor device and the semiconductor device having a MIS structure. Further, it has been found that the present novel semiconductor device has an excellent storage stability for a long period of time because, in the present device, the amorphous silicon hydride layer is not in direct contact with the metal and hence the diffusion of the metal into the amorphous silicon hydride layer is prevented.

The reason for the improvement in collection efficiency is believed to be that, by the junction of the oxide semiconductor having a broad band gap with the amorphous silicon hydride having a narrower band gap than that of the oxide semiconductor, there occurs the so-called window effect, thereby increasing the collection efficiency in the range of short wavelengths.

Accordingly, it is an object of the present invention to provide a semiconductor device which is excellent in energy conversion efficiency as well as collection efficiency.

It is another object of the present invention to provide a semiconductor device which is excellent in storage stability for a long period of time.

It is a further object of the present invention to provide a semiconductor device of the character described above, which is simple in structure and can be produced at reasonable cost.

The foregoing and other objects, features and advantages of the present invention will be apparent to those skilled in the art from the following detailed description taken in connection with the accompanying drawings in which.

Figure 2:
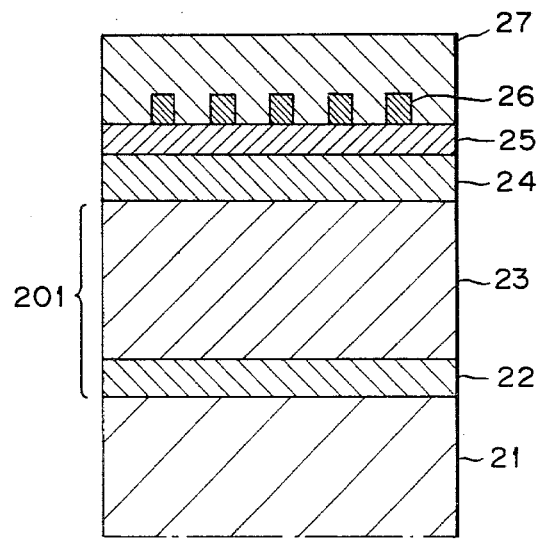
FIG. 2 is a cross-sectional view of a photovoltaic device in which the semiconductor device of FIG. 1 is employed.
Figure 3:
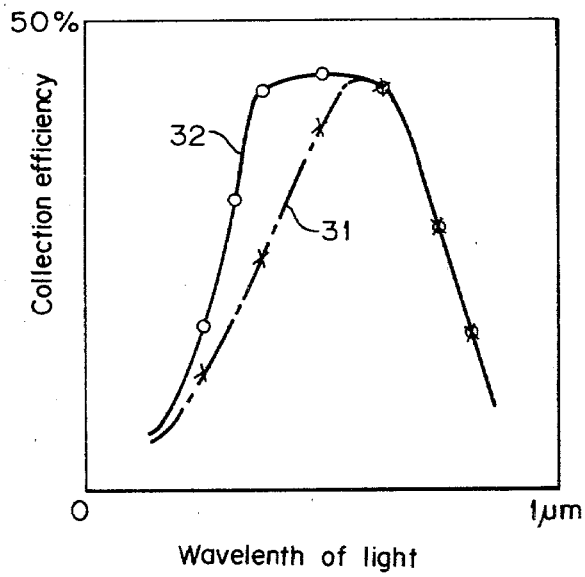
Figure 4:
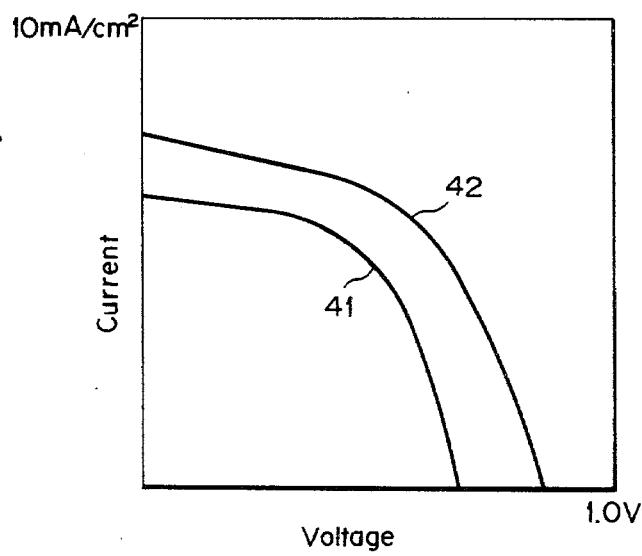

FIG. 3 is a graph showing the relationship between the collection efficiency of the photovoltaic device of FIG. 2 and the wavelength in comparison with that of the conventional Schottky barrier type photovoltaic device; and FIG. 4 is a graph showing the characteristic curve of voltage-current of the photovoltaic device of FIG. 2 in comparison with that of the conventional Schottky barrier type photovoltaic device.

According to the present invention, there is provided a semiconductor device which comprises:

an electrically conductive substrate;

an amorphous silicon hydride layer having a thickness of 0.1 to 5 μm on said substrate;

an oxide semiconductor layer having a thickness of 10 to 1000 Å on a surface of said amorphous silicon hydride layer opposite said substrate; and a metallic layer having a thickness of 50 to 200 Å on a surface of said oxide semiconductor layer opposite said amorphous silicon hydride layer.

Figure 1:
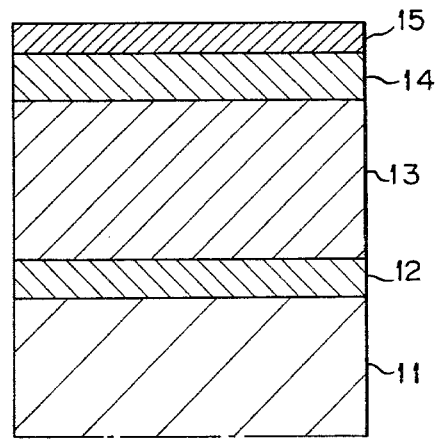
FIG. 1 is a cross-sectional view of a semiconductor device according to the present invention.

Referring now to FIG. 1, there is shown a cross-sectional view of a semiconductor device of the present invention. On a substrate 11, there is formed, through the medium of an ohmic contact layer 12, a layer 13 of amorphous silicon hydride which is obtained by a glow discharge in silane, or a sputtering, vapor deposition or ion plating of silicon in an atmosphere of hydrogen. On the amorphous silicon hydride layer 13 is formed an oxide semiconductor layer 14. Further, on the oxide semiconductor layer 14 is formed a metallic layer 15. By such an arrangement as mentioned above, there is obtained a semiconductor device capable of stably providing a high energy conversion efficiency under solar light irradiation when it is used for the photovoltaic purpose.

The substrate 11 may be of any of materials which are electrically conductive and capable of providing an ohmic contact with the amorphous silicon hydride. Representative examples of such materials include metals such as stainless steel, aluminum, antimony and the like; and $In_2O_3$ and/or $SnO_2$ on glass, where the $In_2O_3$ and/or $SnO_2$ is the conductive material, and the like. The amorphous silicon hydride layer may be entirely of an amorphous silicon hydride formed by a glow discharge in substantially pure silane or the like. However, in order to provide a better ohmic contact with the substrate 11, it is preferred that the first layer 12 of the amorphous silicon hydride layer on the side of the substrate be doped. For simply forming the doped layer 12, there may be employed a method in which a glow discharge is conducted in silane with phosphine ($PH_3$) as the dopant (0.1 to 10 atomic percent based on the silane) to deposit an n-type amorphous silicon hydride in a thickness of about 100 to 500 Å. In practicing the doping, the concentration of phosphine relative to silane may be kept constant so that the dopant concentration is uniform throughout the first layer 12. Alternatively, the dopant concentration of the first layer 12 may be so graded that the concentration of the dopant is a maximum at the interface between the substrate 11 and the first layer or ohmic contact layer 12 and decreases to an insignificant concentration at the interface between the ohmic contact layer 12 and the second layer 13. Besides phosphine, as examples of the dopant gas, there can be mentioned ammonia($NH_3$), arsine($AsH_3$) and diborane($B_2H_6$). The second layer 13 of the amorphous silicon hydride layer is formed by a glow discharge in substantially pure silane, or by a sputtering, vapor deposition or ion plating of silicon in an atmosphere of hydrogen and, therefore, is intrinsic. The thickness of the amorphous silicon hydride layer consisting of the first layer or ohmic contact layer 12 and the second layer or intrinsic layer 13 is 0.1 to 5 $\mu$m, preferably about 0.5 to 2 $\mu$m.

For forming amorphous silicon hydride by a glow discharge in silane, the substrate 11 is heated to 100° to 400° C. in a vacuum chamber evacuated to a pressure of $10^{-3}$ Torr or less, and a silane gas is introduced thereinto to a pressure of 0.1 to 3 Torr. By the term "silane gas" is meant 100% $SiH_4$, $SiH_4$ diluted with Ar or a mixture of $SiF_4$ and $H_2$. In forming the layer 13, the silane gas alone is introduced. In forming the layer 12, there is introduced a dopant gas such as phosphine simultaneously with the introduction of the silane gas. Upon the initiation of a glow discharge, amorphous silicon hydride is deposited on the substrate 11. The manner of generating a glow discharge may be of an inductance type or a capacitance type. Further, in the case of the capacitance type, there may be employed either a direct current discharge or an alternating current discharge. The rate of formation of amorphous silicon hydride depends largely on the degree of vacuum, temperature of the substrate and discharge current, but, in general, is in the range of 0.1 to 100 Å/sec.

In this connection, it is noted that the rotation of the substrate is effective to form a uniform layer of amorphous silicon hydride.

On the other hand, for forming amorphous silicon hydride by a sputtering of silicon in an atmosphere of hydrogen, the substrate 11 is heated to 100° to 400° C. in a vacuum chamber evacuated to a pressure of $10^{-3}$ Torr or less, and a hydrogen gas is introduced thereinto to a pressure of $10^{-3}$ to 1 Torr. In forming the layer 13, the hydrogen gas alone is introduced, while in forming the layer 12, there is introduced a dopant gas such as phosphine simultaneously with the introduction of the hydrogen gas. Subsequently, a sputtering is initiated using silicon as a target to cause amorphous silicon hydride to be deposited on the substrate 11. As described before, as an other method for forming amorphous silicon hydride, there may be employed a vapor deposition or ion plating of silicon in an atmosphere of hydrogen.

On a surface of the amorphous silicon hydride layer opposite the substrate 11 is formed an oxide semiconductor layer 14. For forming the oxide semiconductor layer 14, there may be employed materials which are known as oxide semiconductor materials in the art. Examples of such materials include $TiO_2$, ZnO, $SnO_2$, $In_2O_3$, BaO, SiO, $Cu_2O$, NiO and FeO. Of them, $TiO_2$ and ZnO are most preferred. The oxide semiconductor layer 14 may be formed by the well known techniques of vapor deposition, sputtering or the like. The thickness of the oxide semiconductor layer is 10 to 1000 Å, preferably 50 to 500 Å. The above-mentioned oxides may be employed alone to form a single layer or may be employed in combination to form a multi-layer. Further, it is noted that, in forming the oxide conductor layer, the oxide may be deposited in a reducing atmosphere such as an atmosphere of hydrogen.

Subsequently, on a surface of the oxide conductor layer 14 opposite the amorphous silicon hydride layer is formed a metallic layer 15. Metals suitable for forming the metallic layer are those having a high work function. Examples of such metals include Pt, Pd, Au, Ni, Cr, Ir and Rh. The metallic layer may be formed by the known techniques of vapor deposition, sputtering or the like to have a thickness of 50 to 200 Å so that it is at least semitransparent to solar radiation.

When the so constructed semiconductor device is used as a photovoltaic element or device, it is possible to provide cheap solar cells which are excellent in energy conversion efficiency as well as storage stability.

Referring to FIG. 2, there is shown a cross-sectional view of a photovoltaic device in which a semiconductor device embodying the present invention is employed. Following is an illustration of a photovoltaic device employing a semiconductor device of the present invention. Numeral 21 designates an electrically conductive substrate made of a stainless steel plate (SUS 304) polished and buffed to have a mirror surface. The substrate 21 may alternatively be made of a low work function metal such as aluminum, as explained with reference to FIG. 1. The electrically conductive substrate 21 is heated to 350° C. in a vacuum chamber, and a mixture of silane and phosphine as the dopant gas (atomic ratio, 100:1) is introduced to the vacuum chamber to a pressure of about 0.5 Torr. Upon the initiation of a glow discharge, doped amorphous silicon hydride 22 is deposited on the substrate 21. After the deposition of the doped amorphous silicon hydride as the first layer 22 in a thickness of about 200 Å, the temperature of the substrate 21 is lowered to 300° C. and a silane gas alone is introduced into the vacuum chamber. A glow discharge is effected again to form a deposition of non-doped amorphous silicon hydride as the second layer 23 in a thickness of about 2 μm. Thus, the so-called amorphous silicon hydride layer 201 having an ohmic contact with the substrate 21 is formed. The substrate 21 with the amorphous silicon hydride layer 201 formed thereon is put in an ordinary vapor deposition apparatus (instead thereof, there may alternatively be employed a sputtering apparatus) and subjected to a vapor deposition of an oxide semiconductor, e.g. $TiO_2$ to form an oxide semiconductor layer 24 having a thickness of about 100 Å on the surface of the second layer 23. In this instance, the amorphous silicon hydride layer 201 may be heated and/or the deposition of the oxide semiconductor 24 may be effected in a reducing atmosphere such as an atmosphere of hydrogen or silane. In this embodiment, the deposition of the oxide semiconductor was effected while heating the layer 201 at 120° C. On the surface of the oxide semiconductor layer 24 is deposited platinum to form a metallic layer 25 having a thickness of about 50 Å. In place of platinum, there may alternatively be employed a high work function metal such as gold, palladium or the like. On a portion of the surface of the metallic layer 25 is provided an electrode 26 having, for example, a comb shape. An antireflection layer 27 is formed on the electrode 26 and on the surface of the metallic layer 25 not occupied by the electrode 26. With respect to the formation of the antireflection layer 27, reference may be made to, for example, Japanese Patent Application Publication No. 37718/1978. Thus, there is provided a photovoltaic device employing the amorphous silicon hydride semiconductor device of the present invention.

Referring to FIG. 3, there is shown the relationship between the collection efficiency of the thus fabricated photovoltaic device and the wavelength in comparison with that of the conventional Schottky barrier type photovoltaic device. Curve 32 is of the present photovoltaic device. Curve 31 is of a device which is the same as the present photovoltaic device except that the oxide semiconductor layer is not provided, that is, a typical Schottky barrier type photovoltaic devide. As is apparent from FIG. 3, the present photovoltaic semiconductor device has an excellent collection efficiency for light, particularly, in the range of short wavelengths (the side of higher energy) as demonstrated by Curve 32 and, accordingly, high energy conversion efficiency as compared with Curve 31. The collection efficiency is obtained from the ratio of the carrier density calculated from the value of photogenerated current to the quantity of solar radiation limited with respect to the range of wavelength by means of a filter. The reason for the increase in collection effeciency is believed to be the so-called window effect of the oxide semiconductor layer of the present semiconductor device and, therefore, with the MIS type semiconductor device, such an increase in collection efficiency cannot be expected. Only by the incorporation of the oxide semiconductor layer into the present semiconductor device, can there be attained an increase in collection efficiency and accordingly an increase in conversion efficiency. Further, because of the provision of the oxide semiconductor layer between the amorphous silicon hydride layer and the metallic layer, the stability of the present semiconductor device is also increased.

Referring to FIG. 4, there is shown the characteristic curve of voltage-current of the present photovoltaic device in comparison with that of the conventional Schottky barrier type photovoltaic device. Curve 42 is of the present photovoltaic device. Curve 41 is of a device which is the same as the present photovoltaic device except that the oxide semiconductor layer is not provided, that is, a typical Schottky barrier type photovoltaic device. As is apparent from FIG. 4, the present photovoltaic semiconductor device exhibits an excellent energy conversion efficiency as compared with the conventional Schottky barrier type photovoltaic device. Further, it should be noted that the present photovoltaic semiconductor device stably performs for a period as long as more than several years without undergoing any deterioration.

What is claimed is:

1. A semiconductor device which comprises:
   an electrically conductive substrate;
   an amorphous silicon hydride layer having a thickness of 0.1 to 5 μm on said substrate;
   an oxide semiconductor layer having a thickness of 50 to 500 Å on a surface of said amorphous silicon hydride layer opposite said substrate; and
   a metallic layer having a thickness of 50 to 200 Å on a surface of said oxide semiconductor layer opposite said amorphous silicon hydride layer.

2. A semiconductor device according to claim 1, wherein said amorphous silicon hydride layer comprises a first layer of doped amorphous silicon hydride contiguous to said electrically conductive substrate and a second layer of non-doped amorphous silicon hydride contiguous to said first layer, said second layer being contiguous to said oxide semiconductor layer opposite said first layer.

3. A semiconductor device according to claim 2, wherein said first layer of doped amorphous silicon hydride is formed by means of a dopant gas selected from the group consisting of $NH_3$, $PH_3$, $AsH_3$ and $B_2H_6$.

4. A semiconductor device according to claim 1, wherein said oxide semiconductor layer is composed of at least one member selected from the group consisting of $TiO_2$, $ZnO$, $SnO_2$, $In_2O_3$, $BaO$, $SiO$, $Cu_2O$, $NiO$ and $FeO$.

5. A semiconductor device according to claim 1, wherein said oxide semiconductor layer has a thickness of 50 to 500 Å.

6. A semiconductor device according to claim 1, wherein said metallic layer is of at least one member selected from the group consisting of Pt, Au, Pd, Ni, Cr, Ir and Rh.

* * * * *